United States Patent [19]

Smits

[11] Patent Number: 5,441,600

[45] Date of Patent: Aug. 15, 1995

[54] METHODS FOR ANISOTROPIC ETCHING OF (100) SILICON

[75] Inventor: Jan G. Smits, Quincy, Mass.

[73] Assignee: Boston University, Boston, Mass.

[21] Appl. No.: 89,241

[22] Filed: Jul. 9, 1993

[51] Int. Cl.⁶ .......................................... H01L 21/308
[52] U.S. Cl. .......................................... 216/51; 216/99
[58] Field of Search .......................................... 156/647

[56] References Cited

U.S. PATENT DOCUMENTS

| | | | |
|---|---|---|---|
| 3,909,325 | 9/1975 | Church et al. | 156/657 |
| 4,612,408 | 9/1986 | Moddel et al. | 437/227 |
| 4,662,059 | 5/1987 | Smeltzer et al. | 156/647 |
| 4,994,142 | 2/1991 | Appelbaum | 156/647 |
| 5,207,866 | 5/1993 | Lue et al. | 156/647 |
| 5,238,877 | 8/1993 | Russell | 437/231 |

FOREIGN PATENT DOCUMENTS

| | | | |
|---|---|---|---|
| 60-198826 | 10/1985 | Japan | 156/647 |
| 2-153551 | 6/1990 | Japan | 156/647 |

OTHER PUBLICATIONS

Backlund et al, *J. Micromech. Microeng*, vol. 2, No. 2, Jun. 1992, pp. 75–79.

G. Kaminsky, "Micromachining of Silicon Mechanical Structures", J. Vac. Sci. Technol. B, vol. 3, No. 4, Jul./Aug 1985, pp. 1015–1024.

*Primary Examiner*—Brian E. Hearn
*Assistant Examiner*—Lynne A. Gurley
*Attorney, Agent, or Firm*—Baker & Botts

[57] ABSTRACT

Extremely high aspect ratio vertical walls may be constructed using sodium hydroxide etches of (100) orientation silicon. Mask bodies 18a, 18b and 18c are used to form vertical wall sections 20a, 20b and 20c from a silicon substrate 10.

4 Claims, 2 Drawing Sheets

METHODS FOR ANISOTROPIC ETCHING OF (100) SILICON

TECHNICAL FIELD OF THE INVENTION

This invention relates in general to the field of microelectronic and micromechanical devices and more particularly to an improved method of anisotropically etching vertical walls in (100) silicon.

BACKGROUND OF THE INVENTION

Microelectronic and micromechanical structures formed in semiconductor substrates are the focus of much current development effort. The ability to form vertical walls is a fundamental requirement of such efforts. Vertical wall structures have been formed in (111) silicon however, to date no one has been able to systematically form vertical wall structures in the more common and less expensive (100) silicon. Prior art methods have only been able to isolate the (111) plane in (100) silicon to create walls at an angle of $\cos^{-1}(1/\sqrt{3})$ degress to the substrate surface (in (100) silicon, the (111) plane lies at an angle of $\cos^{-1}(1/\sqrt{3})$, or approximately 54.7356° to the outer surface of the silicon). No one has been able to create wall structures in (100) silicon at angles of greater than 54 degress, let alone the vertical structures needed for many microelectronic and micromechanical devices.

Etching of crystals, including semiconductor crystals, by various etchants has been studied over the past forty years. Herring was among the first to apply Wulf's thermodynamic equilibrium constructions to crystal thermal etching rather than applying kinetics. In addition, Herring derived stability criteria for surfaces according to their surface-free energy. Batterman developed stability theories by etching pits in germanium and noting which planes became dominant over time and noting where etching hillocks appeared on germanium spheres. A refinement of Batterman's principals, accomplished by Irving, included the stability of crystalline corners in germanium. Frank et al. were able to calculate etching trajectories from Frank's kinematic theory of crystal growth. From Frank's theory, transient as well as equilibrium etching shapes of crystals can be predicted. Jaccodine was the first to apply Wulf's equilibrium constructions to chemical wet etching of crystals. Weirauch studied the correlation between the slow etching planes on crystalline silicon spheres and equilibrium surfaces that developed from a mass slot opening on a flat silicon surface. Kendall et al. developed a wagon wheel method for measuring the etch rates in important directions without the use of etched spheres. Kaminsky developed an exact processing procedure for producing geometrically precise silicon structures. Kendall et al. presented a hydration etching model which predicted the etchant concentration in which the etch rate peaked for various etchants. Seidel developed a model which explains the anisotropic etching of silicon by alkaline hydroxides as a result of surface state differences. Ipyam's experiments with cesium hydroxide showed that the dependance of the etch rate of silicon is proportional to the fourth power of the water concentration.

None of these examinations resulted in any etching methods that will allow for the formation of vertical wall structures in (100) silicon. Accordingly, a need has arisen for a method of anisotropic etching of (100) silicon to facilitate the formation of vertical wall structures.

SUMMARY OF THE INVENTION

In accordance with the teachings of the present invention, a method of anisotropic etching is provided which substantially eliminates or reduces disadvantages and problems associated with prior art methods.

According to one embodiment of the present invention, a method of forming a vertical wall structure in a semiconductor substrate is provided which comprises the steps of providing a (100) orientation silicon substrate and etching the silicon substrate in an alkali hydroxide.

According to still another embodiment of the present invention, the vertical wall structures are formed by etching the (100) orientation silicon substrate in sodium hydroxide.

BRIEF DESCRIPTION OF THE DRAWINGS

A more complete understanding of the present invention may be acquired by referring to the accompanying drawings in which like reference numbers indicate like features and wherein.

DETAILED DESCRIPTION OF THE INVENTION

Etching of High Aspect Ratio Vertical Walls

Figure 1:
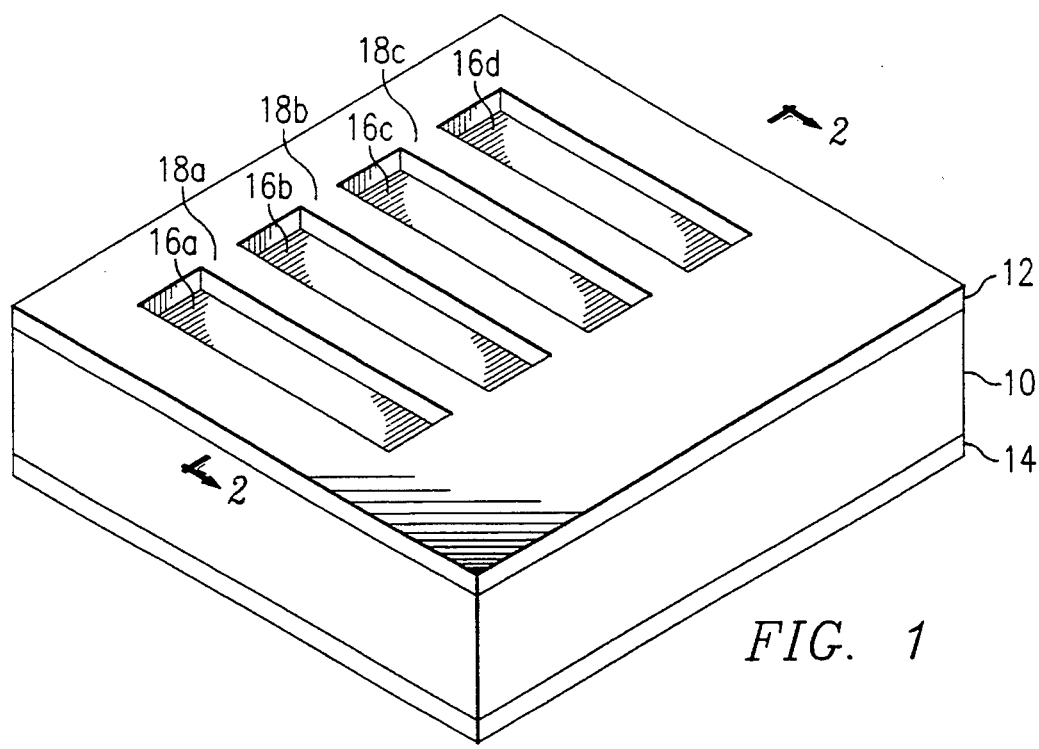
FIG. 1 is a cross-sectional elevational diagram of a semiconductor structure constructed using the teachings of the present invention.

FIG. 1 is a cross-sectional illustration of a portion of a semiconductor substrate 10. Substrate 10 comprises (100) crystal orientation silicon. A mask layer 12 and a back layer 14 are grown on the top and bottom surfaces of substrate 10 respectively. Mask layer 12 and back layer 14 both comprise silicon dioxide grown to a thickness on the order of 0.7 microns. Layers 12 and 14 may be grown using a dry oxidation process, for example, by subjecting substrate to a temperature of 1100° C. for twenty-five hours. The anisotropic etching methods of the present invention use sodium hydroxide. As such, thermal silicon dioxide may be used as an effective mask. Substrate 10 is on the order of 373 microns in average thickness. Four rectangular openings 16a–16d are formed using conventional photolithographic methods in mask layer 12. Openings 16a–16d are on the order of 300 microns in length and are spaced apart to form wall mask portions 18a, 18b and 18c shown in FIG. 1. The rectangular opening 16a, 16b, 16c and 16d are made at 45° to the primary flat of the wafer 10 to align them in the 100 direction on the wafer.

Figure 2A:
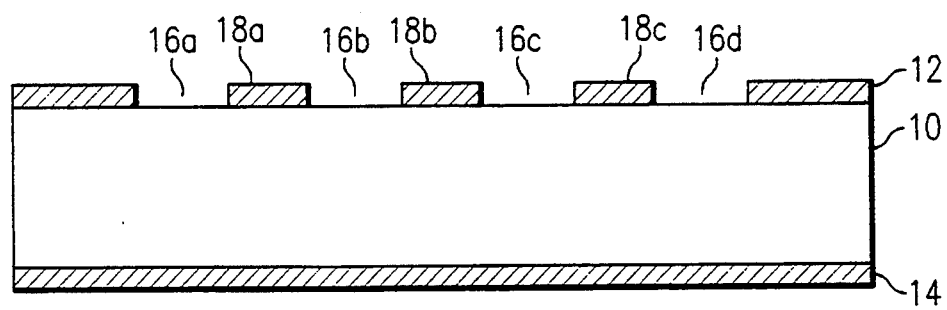
FIGS. 2a and 2b are cross-sectional elevational diagrams illustrating structures constructed using the methods of the present invention.

FIG. 2a is a cross-sectional illustration taken along the plane 2—2 indicated in FIG. 1. FIG. 2a illustrates the structure including the mask portions 18a, 18b, and 18c prior to the alkali hydroxide etch process of the present invention.

In order to form the extreme aspect ratios of the vertical walls constructed according to the teachings of the present invention, the etch rates of silicon and silicon dioxide in alkali hydroxides such as sodium hydroxide at various concentrations and temperatures must be considered so that the mask layer 12 and mask portions 18a–18c and back layer 14 will not etch off prior to the full formation of the vertical walls.

Etch processes are usually carried out in temperatures ranging from room termperature, or approximately 25° C. to on the order of 100° C. The etch rate of a given process will increase exponentially with an increase in temperature and will approximately double for each increase of 9° C. Lower etch rates result in smoother finishes on resulting surfaces and greater durability of mask structures. Etch rate is a function of temperature, time, and etchant concentration. Etchant time can vary from minutes to days depending on the desired features. Etchant concentrations may vary according to the present invention from on the order of 100 to 500 grams of alkali hydroxide per liter of water without appreciable effect on the etch process.

A variety of alkali hydroxide compounds will function as etchants to result in vertical wall structures according to the teachings of the present invention. For example, sodium hydroxide, potassium hydroxide, ammonium hydroxide and cesium hydroxide will all function to a degree. However, the use of sodium hydroxide results in the smoothest finishes on the resultant features created using the etching processes of the present invention.

Figure 2B:
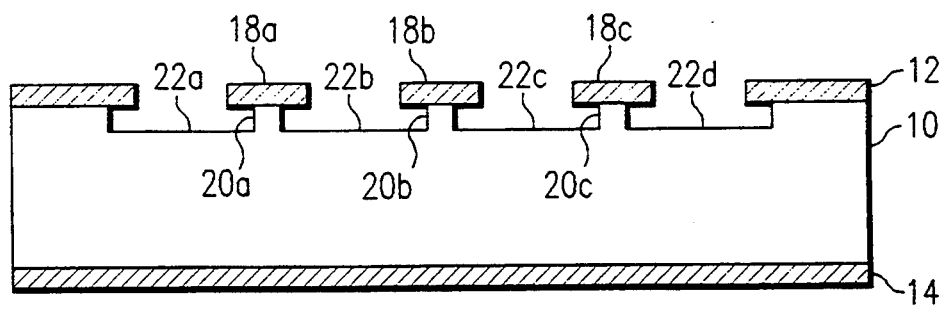

According to one embodiment of the present invention, sodium hydroxide and a temperature of 50° C. is used. The etch rate of silicon at 50° C. in sodium hydroxide is 9.77 microns per hour. The etch rate of silicon dioxide in sodium hydroxide at 50° C. is 0.024 microns per hour. In addition, the etch rates at room temperature of 25° C. were also considered. The etch rate of silicon at 25° C. in sodium hydroxide is 1.08 microns per hour and that of silicon dioxide is 0.0013 microns per hour. Using these etch rates in combination, it is possible to etch approximately 300 microns of silicon and still maintain a viable mask layer of silicon dioxide. If the structure in FIG. 2a is etched in sodium hydroxide at 25° C. for a total time of 84 hours and etched in sodium hydroxide at 50° C. for 22 hours, the resulting structure is shown in FIG. 2b. The temperature of the etchants are maintained by using an etch beaker placed in a water bath so that the temperature can be controlled to within 0.5° C.

Referring to FIG. 2b, the etch process results in vertical wall structures 20a, 20b, and 20c. Vertical wall structures 20a–20c have a thickness varying from on the order of 1 micron to on the order of 2 microns. The process results in the smooth vertical sidewalls of vertical walls 20a–20c. In addition, the bottom surfaces indicated at 22a, 22b and 22c were plain and smooth and featureless.

Etching of Additional Planes on Vertical Walls

Using other methods of the present invention, wafers were etched for 20 hours at 50° to give vertical walls which were 55 microns thick, 300 microns long and 204 microns high. The etching processes once again used sodium hydroxide etchant and a silicon dioxide mask formed on a (100) orientation silicon substrate. The silicon dioxide mask was removed after 18.5 hours and the etching was continued without the mask. The etching without the mask gave rise to a bevel where the (111) plane intersects the (001) top surface of the wall.

This bevel corresponds to the (115) plane. The (115) plane was not smooth but rather demonstrated a wavy, scalloped or terraced appearance. In addition, between the top surface of the wall and the sides of the wall, two more bevels developed. These bevels were found to correspond to the (102) and (201) planes. These (102) and (201) planes were very smooth. These planes demonstrated an etch rate on the order of 16 microns per hour.

Etching of Other Structures

Figure 3:
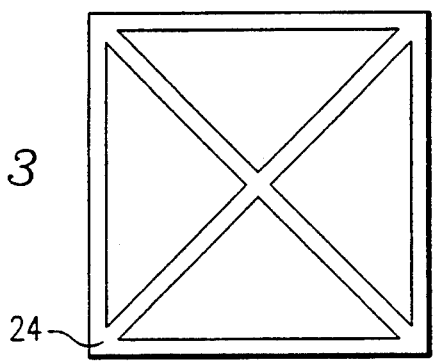
FIG. 3 is a top view of a mask used in methods of the present invention.

FIG. 3 illustrates an "X" mask which may be used according to the teachings of the present invention to form vertical walls in other structures. For example, walls with a thickness of 2 microns may be etched using an "X" mask such as "X" mask 24 shown in FIG. 3. Walls on the order of 22 microns high may be formed after underetching 20.6 microns from each side under the "X" mask 24 using sodium hydroxide for 120 minutes at 55° C. The sides of the 22 micron-high walls were smooth (100) planes. Etching was stopped at a point where the walls were 2 microns thick. At this time, the oxide mask was removed using a buffered oxide edge. The floor of the substrate formed a frustum centered at the center of the "X" mask 24 and bordered by (111) planes.

Using still another method of the present invention, a pyramid was etched in (100) orientation silicon using sodium hydroxide at 40° C. and the same "X" mask 24 shown in FIG. 3. After etching for 135 minutes, the two micron vertical walls described previously were etched away completely, forming a frustum with sharp edges lined by (111) planes. When the ridge made of the (111) and the ($\bar{1}$11) plane was formed, the etching was stopped. At this point, two separate procedures were instituted. First, the frustum was continued to etching with the mask in position. Secondly, the frustum was etched after the mask was removed.

Figure 4:
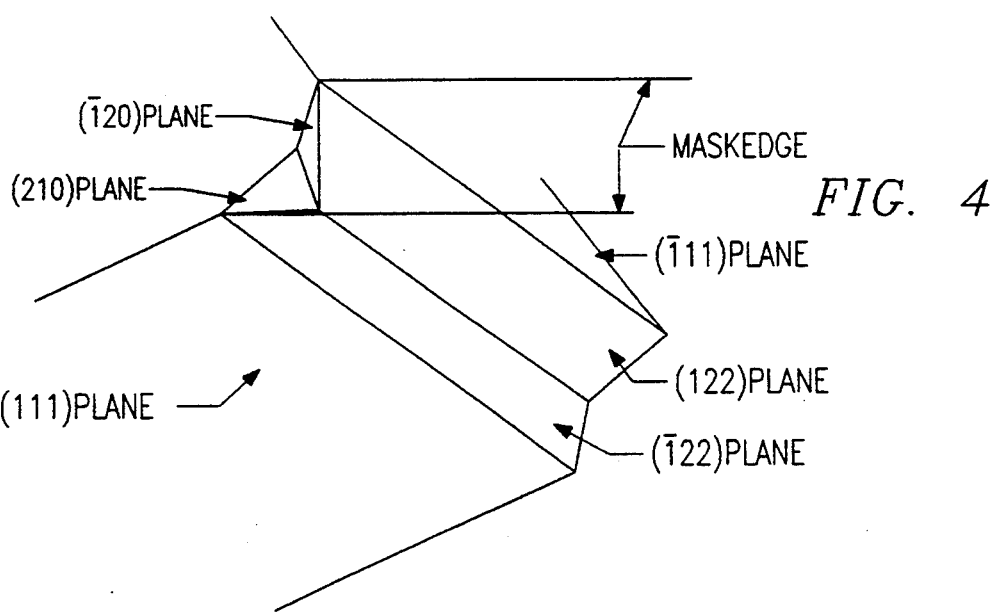
FIGS. 4 and 5 are perspective drawings of crystal planes constructed using methods of the present invention.

When the frustum was allowed to etch further with the oxide mask on, a concave groove was formed at the edge of the frustum.. This groove was lined by the (122) and the (212) planes. In addition, near the top of the frustum a set of vertical of (210) and (120) planes were observed. The etch rate of the (122) planes was found to be 9 microns per hour. Initially, the (122) planes were not well developed, but rather appeared terraced or granular. The juxtaposition of the planes mentioned are shown in FIG. 4.

Figure 5:
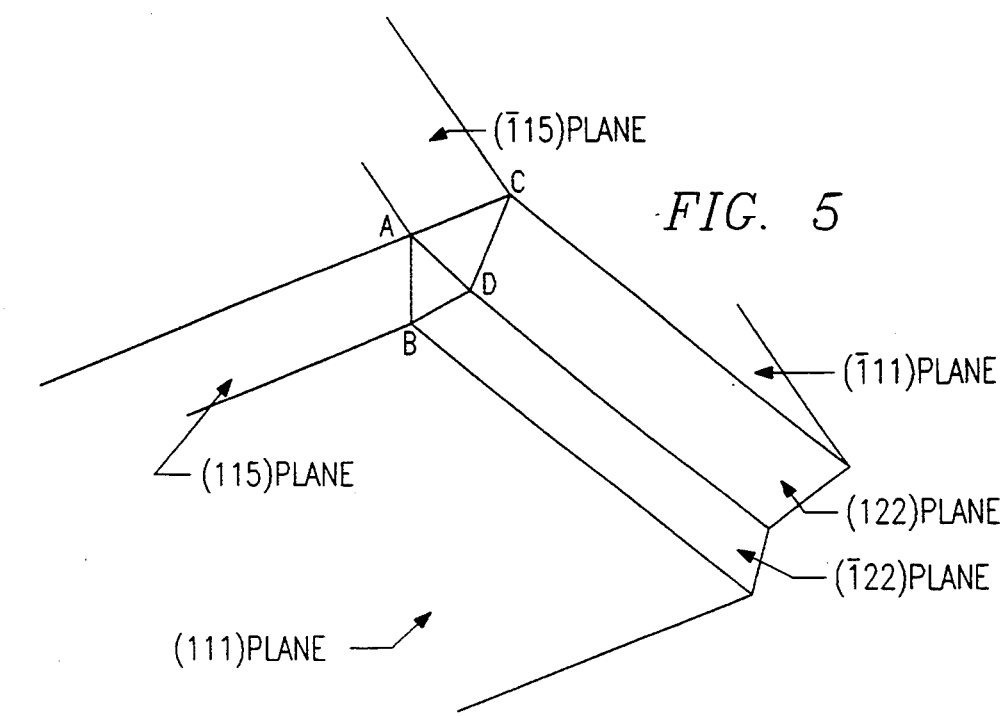

In a second procedure, the "X" mask 24 was removed and the etching was continued. According to this process, a protruding corner was exposed made of the intersections of the (111), ($\bar{1}$11), and the (001) planes. Theoretically, this corner is occupied by one atom which, due to the directions of the covalent bonds, can have an electronic bond with only one atom in the crystal; the other three neighboring atoms having been removed in the previous etching. Because of its weak binding to its neighbor atom, this corner atom is lost quickly in further etching. The wafer was etched for 120 minutes at 40° C. in sodium hydroxide. This etch process resulted in the corner mentioned previously becoming concave. The corner in question is illustrated in FIG. 5. For convenience and explanation, the intersections of certain of the planes have been labelled A, B, C and D. The ABD plane comprises a ($\bar{1}$22) plane. The ACD plane is a (122) plane. The etching rates of these planes is 2.8 microns per hour at 40° C. The bevel between the (111) and the (100) plane forming the top of the frustum is the (115) plane. The etch rate of the (115) is 12 microns per hour at 50°.

Although the structures and methods of the present invention have been described in detail, it should be understood that various changes, substitution and alterations may be made to the embodiments described herein without departing from the spirit and scope of the invention as solely defined by the appended claims.

What is claimed is:

1. A method for forming a structure in a substrate, comprising the steps of:
   providing a crystalline substrate having (100) crystal orientation and a substantially planar outer surface:
   forming a wall in the substrate at an angle to the outer surface of greater than $\cos^{-1}(1/\sqrt{3})$ degrees by etching with an alkali hydroxide
   wherein said step of forming a wall comprises the step of forming a wall in the (100) plane perpendicular to the outer surface; and
   forming a mask, which has edges aligned with the (100) crystal orientation, disposed outwardly from the outer surface and covering portions of the outer surfaces; and
   etching the substrate not covered by the mask;
   wherein said step of etching comprises the step of etching the substrate at a temperature of about 25 degrees centigrade and subsequently etching the substrate at a temperature of about 50 degrees centigrade.

2. The method of claim 1 wherein said step of forming a wall comprises the step of forming a wall in the (100) plane perpendicular to the outer surface.

3. The method of claim 1 wherein said step of forming a mask comprises the step of growing a layer of silicon dioxide on an outer surface of a substrate comprising silicon.

4. The method of claim 1 wherein said step of etching comprises the step of etching the substrate not covered by the mask using sodium hydroxide.

* * * * *